United States Patent [19]

Juhasz et al.

[11] 4,303,850
[45] Dec. 1, 1981

[54] REAL TIME CLOCK USING COMPUTER AND SEPARATE COUNTING MEANS

[75] Inventors: John E. Juhasz, Lake Orion; James E. Krass, Jr., St. Clair Shores, both of Mich.

[73] Assignee: Rockwell International Corporation, Pittsburgh, Pa.

[21] Appl. No.: 20,279

[22] Filed: Mar. 14, 1979

Related U.S. Application Data

[63] Continuation-in-part of Ser. No. 881,223, Feb. 27, 1978, abandoned.

[51] Int. Cl.³ .............................................. G06M 3/12
[52] U.S. Cl. ............................. 235/92 FP; 235/92 T; 235/92 CC
[58] Field of Search ............ 235/92 CC, 92 T, 92 FP, 235/92 MS, 92 TC, 92 CA; 368/48, 5, 6

[56] References Cited

U.S. PATENT DOCUMENTS

| | | | |
|---|---|---|---|
| 3,946,219 | 3/1976 | Lucas | 235/92 FP |
| 4,031,363 | 6/1977 | Freeman et al. | 235/92 T |
| 4,089,058 | 5/1978 | Murdock | 235/92 MS |
| 4,168,531 | 9/1979 | Eichelberger et al. | 235/92 T |
| 4,189,635 | 2/1980 | Sheller | 235/92 CA |

FOREIGN PATENT DOCUMENTS

1414875  11/1975  United Kingdom ................. 368/48

Primary Examiner—Joseph M. Thesz

[57] ABSTRACT

Apparatus for maintaining a real time clock normally incremented by a CPU when power is provided thereto and maintained by a separate counting means when power is removed from the CPU, the separate counting means powered independently of the CPU power source. Apparatus is also disclosed for synchronizing the separate counting means such that the real time clock maintained by the CPU may be updated for the time interval in which the CPU was inoperative without loss of real time clock accuracy.

7 Claims, 7 Drawing Figures

REAL TIME CLOCK USING COMPUTER AND SEPARATE COUNTING MEANS

This application is a continuation-in-part of application Ser. No. 881,223 filed Feb. 27, 1978, now abandoned.

BACKGROUND OF THE INVENTION

1. Field of the Invention

The invention is in the field of data monitoring and recording systems particularly adapted for use on vehicles.

2. Description of the Prior Art

Prior data recording apparatus has been utilized for recording various engine parameters for use as diagnostic and maintenance tools for land vehicles and aircraft. Additionally, recording devices have been utilized in connection with interstate truck travel to keep track of gasoline purchases in various states to take advantage of tax rebates and the like. Representative examples of these prior art devices as shown in U.S. Pat. Nos. 3,099,817; 3,964,302; 4,050,295; 3,864,731; 3,938,092; 3,702,989; and 3,792,445. Typically, these prior art devices utilize either singly or in combination various display means, manual input means, and recording means in the form of either paper or magnetic tape. In some instances only alarm indications are provided or pertinent data is displayed as shown, for example, in U.S Pat. Nos. 4,050,295 and 3,964,302. In other cases entire vehicle performance data is recorded as discussed in U.S. Pat. No. 3,099,817. Attempts have been made to reduce the amount of recording and consequent tape usage by means of hardware and software selective data recording such as disclosed in U.S. Pat. Nos. 3,792,445 and 3,702,989.

A particular disadvantage of these prior art devices is their lack of versatility with regard to usage and recording of data and a reliance upon bulky and expensive magnetic or paper tape as a primary recording medium.

Of particular importance in utilizing data vehicle monitoring recording apparatus is the necessity to keep accurate track of time so that various malfunctioning engine parameters may be exactly correlated with the time of occurrence. Although various clocking techniques have been developed in the prior art, such as, for example, apparatus disclosed in U.S. Pat. Nos. 4,031,363, 4,022,017, and 3,889,461, these systems do not provide the necessary time tracking accuracy and reliability coupled with power conservation needs required in land vehicles. In particular, when a computing means such as a microprocessor is utilized to selectively filter and store data as well as provide a real time clock function there is a need for maintaining a high accuracy in the real time clock function despite inoperability of the microprocessor when the vehicle engine is turned off. In this connection the prior art has not addressed itself to the problem of shutting down the microprocessor in an orderly fashion to protect data being processed in the event of power failure or engine turnoff.

SUMMARY OF THE INVENTION

Accordingly, it is an object of the invention to provide a versatile vehicle monitoring and recording system for providing accurate data parameters useful for record keeping, performance and maintenance applications.

Yet another object of the invention is to provide a vehicle monitoring and recording system utilizing a computing means to read the various input parameters and selectively store pertinent input parameters in a solid state memory.

A further object of the invention is provide an accurate real time clock circuit in a vehicle monitoring and recording system wherein an onboard microprocessor is utilized to accurately track time when the engine is on and a separate counting circuit is utilized for accurate time keeping purposes when the engine is off. Means are also provided for synchronizing the counting circuit with the microprocessor counting circuit when the engine is turned back on.

In accordance with the invention there is provided a clock counting apparatus comprising: means for generating first clock signals, first electronic counting means for counting the first clock signals, power supply means connected to the first counting means for powering same, means for generating second clock signals, second electronic counting means for counting the second clock signals, means for connecting the second electronic counting means to the power supply means for powering same, means for disconnecting the power supply means from the first counting means, means for reconnecting the power supply means to the first counting means, and means for incrementing the count in the first counting means in proportion to the count accumulated in the second counting means during the time period in which the first counting means is disconnecting from the power supply means.

BRIEF DESCRIPTION OF THE DRAWINGS

These and other objects of the invention will become clear in connection with the foregoing description taken in conjunction with the drawings wherein.

DETAILED DESCRIPTION OF THE PREFERRED EMBODIMENT

System Overview

Figure 1:
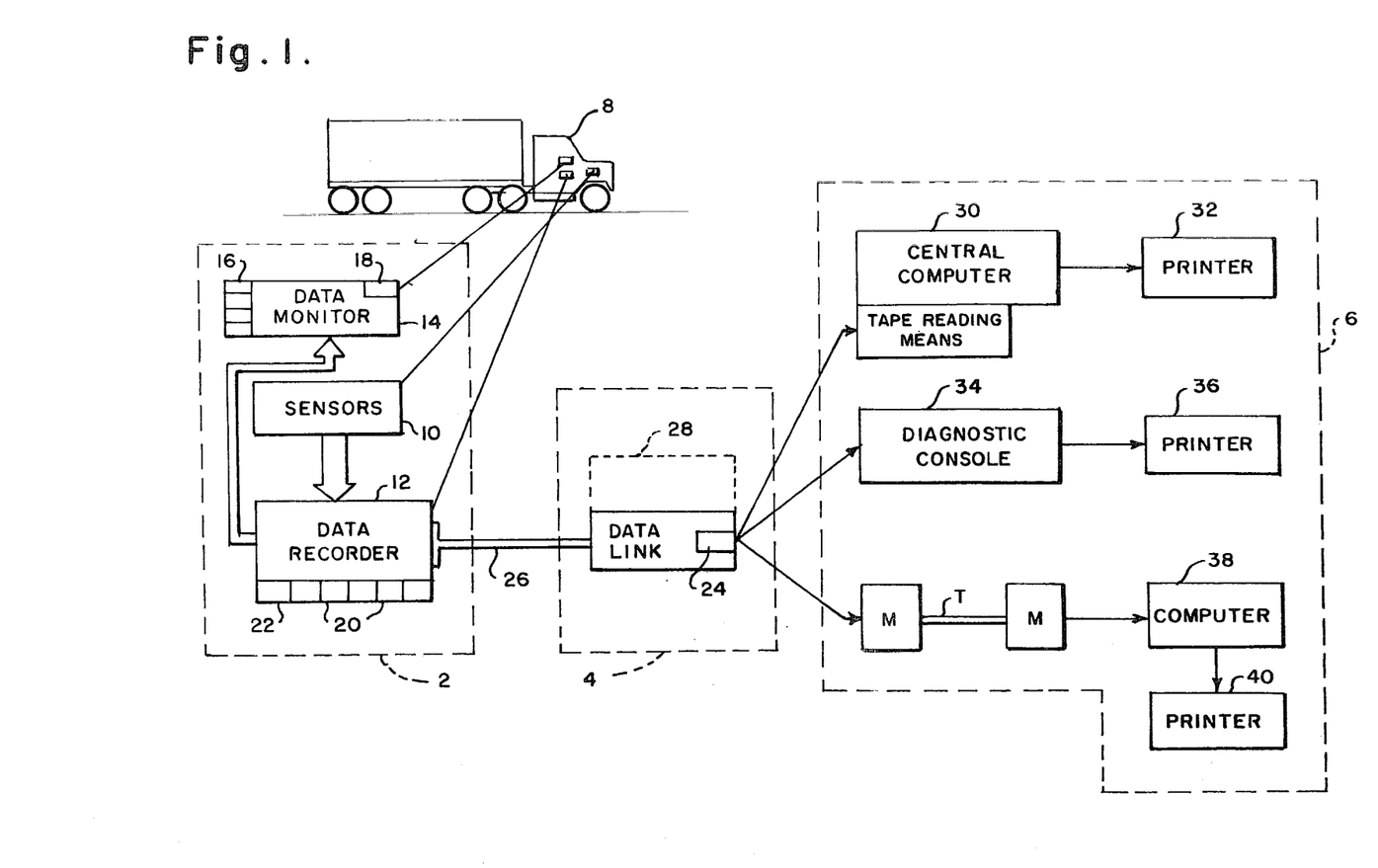
FIG. 1 is an overall block diagram of the vehicle monitoring and recording system.

A block diagram of the vehicle monitoring and recording system 1 in accordance with the invention is illustrated in FIG. 1. The system has three major components, namely, an on-board subsystem 2, a portable data link 4 and a remote data processing subsystem 6. The on-board subsystem 2 is indicated as being housed within a vehicle such as the cab of truck 8 and is seen to comprise a plurality of sensors generally indicated at 10, a data recorder 12 and a data monitor 14. The sensors 10 are positioned in various locations throughout the vehicle and typically provide both analogue and digital signals to the data recorder 10. The data recorder 10 is in turn interconnected to the data monitor 12 so that the operator of the vehicle may have access to the sensor data on a real time basis. An input means such as a plurality of switches 16 are provided on the data monitor to allow the operator to select particular data for display on display means 18. The display means 18 may comprise, for example, a seven segment LED display. The data recorder 12 may also comprise a plurality of switches 20 for manual input of data to be recorded. Switches 20 may in fact comprise an entire keyboard so that digital data or coded data may be fed into the data recorder 12. For example, when the vehicle passes across a state line the operator may enter a code representing the new state entered which will automatically effect recordation of the time of day and odometer reading to form a record for tax rebate purposes. Further, switches 20 may comprise designated input keys such as a "snapshot" key 22 which effectively enables the data recorder to record all sensed data at that particular instant of time. In this manner, the vehicle operator may override automatic data recording at will as, for example, upon the occurrence of an abnormal operating condition. The snapshot key 22 thus permits recording of data at the instant the operator notices an abnormal condition, thus permitting a correlation of the time at which the condition occurred thus allowing for proper reconstruction of the malfunction during off-line processing. The data monitor 14 is not required for operation of the system 1 and indeed, the apparatus may be employed only utilizing the sensors 10 and data recorder 12.

The portable data link 4 is utilized to extract data from the data recorder 12 and store same onto a magnetic tape means 24. A flexible cable 26 is provided with pin connected terminals to allow simple connect/disconnect capabilities of the data link 4 to the data recorder 12. Transmission of data from the data recorder 12 to the data link 4 is achieved by a read command provided by switches 20. The data link 4 may also comprise display means generally indicated at 28 for displaying data stored on the magnetic tape means 24. Typically, the data link 4 operates on its own battery source (not shown). Further, the data link 4 may be provided with an optical display means to permit display of data on the magnetic tape means 24.

Vehicle data on tape 24 is transmitted to the remote computing subsystem 6 for detailed processing of the data originally stored in memory means of the data recorder 12. A number of different paths for data processing are illustrated in FIG. 1. For example, the magnetic tape means 24 may be fed to input means of a central computer 30 where data may be sorted and formatted for printing on printer 32. Alternately, the data from the magnetic tape means 24 may be fed into input means of a diagnostic console 34 where the data may be sequentially viewed on display means thereof. For example, data associated with a particular day's operation may be scanned without any prior sorting and utilized by mechanics as a diagnostic tool. The diagnostic console 34 may additionally be utilized to provide the tape data to a printer 36 to provide hard copies of the daily operating parameters. Yet additionally, data from the magnetic tape means 24 may be applied to a motor communication link M for transmission over telephone lines T for subsequent feeding to a distantly located computer 38 and printer 40. It is clear that the cable 26 of the data link may alternately serve as a means for reading the data from tape means 24 into any of the processing channels set forth in FIG. 1.

The particular type of data that may be provided as an output from the remote data processing subsystem 6 is illustrated hereinbelow. A particular example of a truck fleet report may comprise three major sections, namely, a vehicle utilization report, a performance exception report and a parameter profile report. The vehicle utilization report may comprise a summary of information which is related to the modes of vehicle use over the reporting period and is typically reported on a daily basis. Such information may be provided, as, for example, vehicle mileage, fuel consumption, engine operating hours, average MGP, average speed etc. The information thus provided at the output of the remote data processing subsystem 6 for this type of report is illustrated in Table I. Thus, it is seen that on Apr. 20, 1977 vehicle No. 1234 consumed 0.1 of a gallon of fuel when the engine was in idle and 0.3 of a gallon of fuel when the engine was operating at road speeds. The relative inactivity of the vehicle on the day in question is thus easily apparent. In this fashion, a truck fleet manager has easy access of the daily activity of each of a large number of vehicles. Total figures for the period of time in question may also be provided. Vehicle status codes are used to indicate which sensed parameters exceeded their corresponding threshold values and the correspondence of the vehicle status code with the sensed operating parameters are indicated in Table II.

TABLE I

| Vehicle No. 1234 Vehicle Trip Report 4/20/77 Thru 4/22/77 | | | | | | |
|---|---|---|---|---|---|---|
| DATE | | ENG HRS | FUEL GAL | TOTAL MILES | AVE SPD | AVE MPG | VEHICLE STATUS |
| 4/20/77 | Idle | .21 | .1 | | | | |
| WED | Road | .12 | .3 | .3 | 2.5 | 1.2 | — |
| 4/21/77 | Idle | 6.10 | 1.9 | | | | |
| | Road | 17.67 | 211.6 | 951.0 | 53.8 | 4.5 | D |
| 4/22/77 | Idle | 3.15 | 1.0 | | | | |
| | Road | 7.49 | 79.2 | 405.8 | 54.2 | 5.1 | DE |
| Total | | 9.46 | 25.28 | 294.1 | 1357.1 | 53.7 | 4.6 | DE |

A representative example of the performance exception report is shown in Table II. In this type of report only abnormal vehicle operating parameters are recorded. For example, on Apr. 21, 1977 the battery voltage was seen to reach a peak value of 13.5 volts which is above the normal or threshold value in this case of 12.7 volts. The number of times the battery exceeded the threshold value is also indicated as well as the duration in hours during which such excess existed. On the same day, oil pressure is seen to have dropped to a peak low value of 2.5 PSI in comparison with a threshold value of 20 PSI. Further, the oil pressure dropped below threshold a total of five times for a total duration of 0.05 hours. (An asterisk next to the parameter measured indicates a below threshold parameter.) Table II thus provides valuable data that may be utilized for routine maintenance purposes as well as to anticipate near future maintenance adjustments in addition to diagnostic testing and analysis.

It will also be appreciated that the storage of data within the data recorder 12 is greatly compressed inasmuch as the computer software performs a data threshold function so as to store only the number of times a threshold is exceeded, the time duration and the peak value. It is thus not necessary to allocate large sections of memory or utilize large amounts of magnetic tape and the like to continuously store all operating parameters as is typical with prior art systems.

TABLE II

| VEHICLE STATUS | PARAMETER | DATE | DURATION | # OF EVENTS | PEAK VALUE | THRESHOLD |
|---|---|---|---|---|---|---|
| | Vehicle No. 1234 | Abnormal Vehicle Operation | 4/20/77 Thru 4/22/77 | | | |
| D | MPH | 4/21/77 | 6.41 | 81. | 81. | 60. |
| D | MPH | 4/22/77 | 3.74 | 55. | 72. | 60. |
| E | RPM | 4/22/77 | 3.20 | 74. | 2280. | 1950. |
| 0 | Bat Vlt | | | | | 12.7 |
| | | 4/21/77 | 16.66 | 1. | 13.5 | 12.7 |
| | | 4/22/77 | 6.74 | 2. | 13.5 | 12.7 |
| 1 | Oil Pres* | | | | | 20.0 |
| | | 4/21/77 | .05 | 5. | 2.5 | 20.0 |
| | | 4/22/77 | .03 | 3. | 8.4 | 20.0 |
| 6 | C. Pres* | | | | | 10.0 |
| | | 4/21/77 | 16.20 | 4. | .0 | 10.0 |
| | | 4/22/77 | 6.72 | 1. | .0 | 10.0 |
| 7 | Air Pres* | | | | | 70.0 |
| | | 4/21/77 | 4.56 | 31. | 18.0 | 70.0 |
| | | 4/22/77 | 1.67 | 47. | 46.0 | 70.0 |
| | IGN ON/OFF | | | | | |
| | | 4/20/77 | | 4. | | |
| | | 4/22/77 | | 1. | | |

The parameter profile report is illustrated in Table III. Typically, the information provided represents a data snahshot of all parameters at the particular time listed. The computer module within the data recorder 12 may automatically record data snapshots at various periodic times, as for example, whenever the engine is turned off or, if desired, at twelve midnight of every day. In yet another example the computer modules within the data recorder 12 may store a data snapshot only if a programmed criteria is met, which criteria may involve an interrelationship of a plurality of sensed vehicle parameters. Specifically, a data snapshot could be taken every hour if the vehicle is continually traveling over 30 mph and the engine is revolving at greater than 1200 rpm during the entire hour. This criteria will essentially ensure that the data snapshot corresponds to highway use. Thus, valuable specific data can be maintained to provide individual dynamic vehicle histories for comparative studies providing a unique source of data for maintenance and diagnostic use.

Further, by utilizing the snapshot key 22, the operator may manually initiate a data snapshot recording whenever desired, as for example, upon detection of some abnormal running condition.

TABLE III

| PARAMETER | DATA SNAPSHOT - Vehicle No. 1234 | | |
|---|---|---|---|
| | DATE 4/21/77 | DATE 4/21/77 | DATE 4/22/77 |
| TIME | 2:30 | 6:39 | 1:16 |
| MILEAGE | 45.1 | 276.6 | 30.0 |
| MILES PER GALLON | 3.9 | 6.0 | 6.6 |
| MILES PER HOUR | 59. | 57. | 55. |
| RPM | 1810. | 1840. | 1720. |
| BATTERY VOLTS | 13.0 | 13.1 | 13.0 |
| OIL PRESSURE | 48.6 | 48.3 | 47.6 |
| FUEL FILTER | 2.0 | 3.0 | 2.3 |

TABLE III-continued

| PARAMETER | DATA SNAPSHOT - Vehicle No. 1234 | | |
|---|---|---|---|
| | DATE 4/21/77 | DATE 4/21/77 | DATE 4/22/77 |
| COOLANT PRESSURE | 3.0 | 5.0 | 3.5 |
| AIR PRESSURE | 75. | 87. | 86. |
| BRAKE TEMP | 85. | 68. | 82. |
| COOLANT TEMP | 158. | 162. | 159. |
| FUEL TEMP | 39. | 51. | 62. |
| OIL, COOLANT LEVEL* | 3 | 3 | 0 |

*Legend - Oil, Coolant Level
0 - Both levels low
1 - Oil level low
2 - Coolant level low
3 - Both levels satisfactory

On-Board Subsystem

Figure 2:
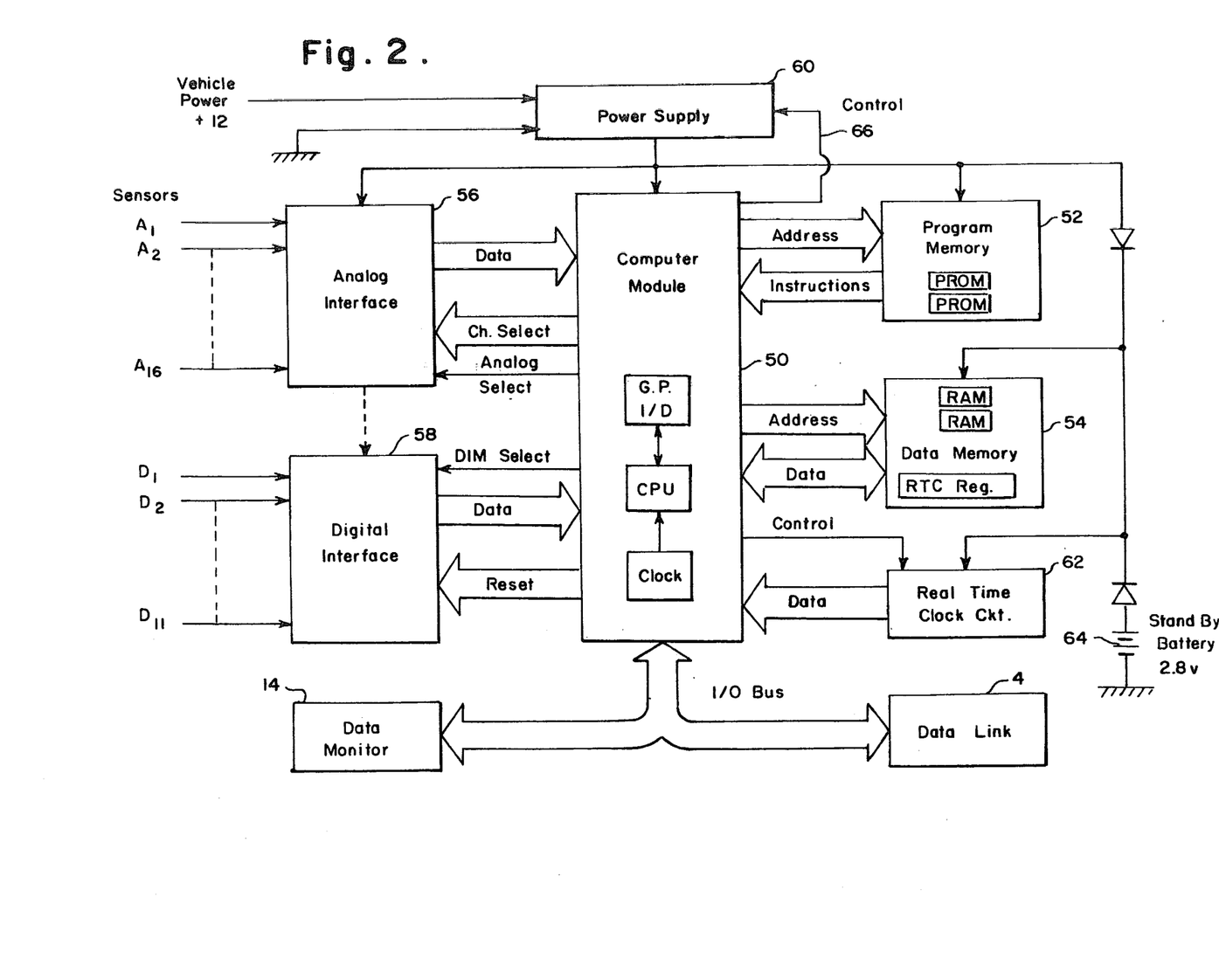
FIG. 2 is a block diagram of the on-board subsystem in accordance with the invention.

A block diagram of the on-board subsystem 2 is illustrated in FIG. 2. The on-board subsystem 2 is seen to comprise a computer module 50, program memory 52, data memory 54, analog interface 56, digital interface 58, power supply 60 and real time clock circuit 62. The analog interface 56 receives analog data from a plurality of sensors along lines generally designated A1-A6. Similarly, digital interface 58 receives a plurality of input digital signals from digital sensing means along lines generally designated D1-D11. It is clear that any number of analog and digital sensors may be employed consistent with the use requirements of the system.

The computer module 50 may comprise any of a number of well known microprocessors currently available. For example, a suitable device is the PPS-8 microprocessor including associated general purpose I/O, clock generator and memory units manufactured by Rockwell International Corporation, Anaheim, Calif. The program memory 52 may comprise, for example, a programmable read only memory (PROM) and may be fabricated utilizing PROM chips, Model No. NM5204Q. A plurality of address lines are provided from the computer module 50 to selectively address locations within the program memory 52. Sequentially addressed locations provide instructions fed to the computer module 50 governing the polling routine for the sense data, threshold data selection requirements and the like. The program residing in program memory 52 may be tailored to specific user uses to govern the manner in which the data is polled and the format of the data stored in data memory 54.

Data memory 54 may comprise, for example, dynamic random access memory (RAM) chips for permitting storage of processed data from the computer module 50 and may be fabricated utilizing thirty-two by one bit RAM chips, Model No. MM74C929. A plurality of address and data lines interconnect the data memory 54 to the computer module 50 to permit bidirectional data transfer to selected memory addresses. A selected address within the data memory may be chosen to serve as a real time clock register.

A real time clock circuit 62 is also provided on the on-board subsystem 2 and is utilized to provide clock pulses to the computer module 50 for time keeping purposes. Additionally, the real time clock circuit 62 provides clock pulses to a separate counter which forms part of the clock circuit and is utilized to maintain accumulated time when the computer module 50 is shut down as, for example, when the engine is turned off. A standby battery 64 is interconnected to the real time clock circuit 62 as well as the data memory 54. When the engine is shut down, the standby battery 64 is utilized to provide the necessary operating voltages for the real time clock circuit 62 to power the separate counter contained therein. Further, standby battery 64 maintains operating voltages to the RAM chips within data memory 54 so that data memory 54 is effectively a non-volatile memory. Normally, during engine operating conditions, power supply 60 supplies the necessary voltage requirements to data memory 54 and real time clock circuit 62 as well as the other units residing on the on-board subsystem 2. Thus, system power is derived from the 12 volt vehicle battery (not shown) and power supply 60 provides the necessary power conversion, conditioning and regulation for distribution to the various modules and sensors. A control line 66 is shown connecting the computer module 50 to the power supply 60. The control line thus permits microprocessor control of the power supply shut-down to all modules, with the exception, of course, of the data memory 54 and real time clock circuit 62 which are at that time supplied by the standby battery 64. The computer module 50 thus senses ignition turnoff or power failures as high priority interrupts and the normal activity of the microprocessor is suspended in favor of a data protect or shut-down routine. After all data being processed is properly stored, the last instruction of the shut-down routine effectively implements the power supply shut-down (via line 66) which in turn shuts down power to the computing module itself. This mode of controlled shut-down assures safe preservation of critical data regardless of the cause of the power loss. Data is likewise preserved prior to the CPU directed power shut-off in response to a sensed engine-off condition.

Analog Interface

Figure 3:
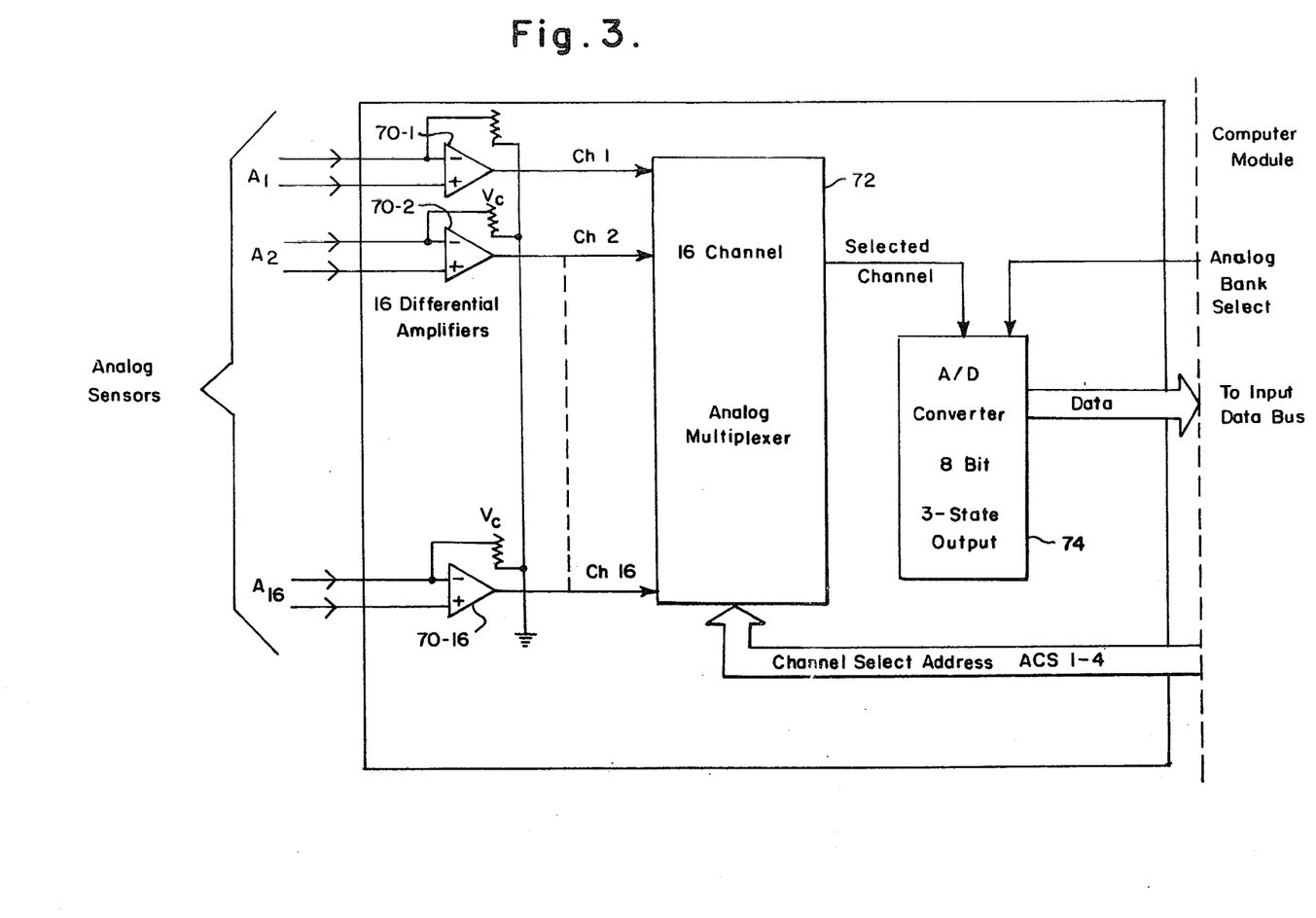
FIG. 3 is a schematic diagram of the analog interface.

A block diagram of the analog interface 56 is shown in FIG. 3. Typically, each analog channel provides a difference input signal to a voltage comparator 70, as for example, National, Model No. LM124AN. Each of the voltage comparators is identified by a channel suffix to designate the corresponding analog input channel. It is also noted that each voltage comparator 70 has a corresponding reference potential input which may be individually set at a desired voltage level. Noise discrimination filters and gain control resistor circuits may also be provided (not shown). Each of the outputs of the voltage comparator 70 are fed to a sixteen channel analog multiplexer 72 (as for example two eight channel data selectors, Model F34051) where the analog data is sequentially selected and fed to an analog-to-digital converter 74. The converted digital data is then fed to the computer module 50 for further processing.

Digital Interface—Overview

Figure 4:
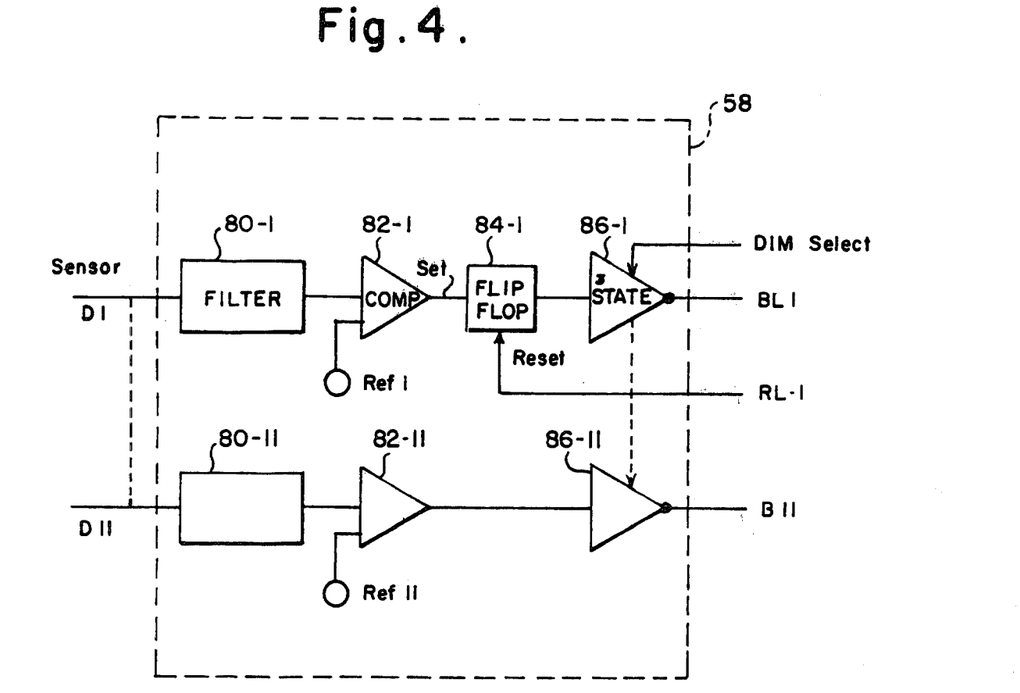
FIG. 4 is a schematic diagram showing an overview of the digital interface.

FIG. 4 is a schematic diagram of the digital interface 58. Two representative digital channels are illustrated corresponding to a first channel providing sensed data along line D1 and a last channel providing sensed data along line D11. The channel associated with line D1 is shown to comprise a filter 80, comparator 82, flip-flop 84 and tri-state buffer 86. After filtering of the data in filter 80 the data is compared to a reference voltage source which is utilized to discriminate the sensed data signal from noise levels. The output of comparator 82 is then utilized to set flip-flop 84 which remains set until reset by the microprocessor along reset line RL-1. The microprocessor may select the output from channel 1 as well as the remaining channels by means of enabling the tri-state buffer 86 via a control signal along line DIM select (digital interface module-select). The channel associated with the digital sensor having an input along line D11 likewise comprises a filter 80, comparator 82 and tri-state buffer 86. In this case, however, the flip-flop 84 is not utilized. These channels typically represent signal levels which do not change very often and consequently do not have to be latched in a flip-flop. As before, prefixes have been utilized to designate the channel associated with the various devices 80, 82, 84 and 86.

DIGITAL INTERFACE—DETAILED DESCRIPTION

Real Time Clock Circuit

Figure 5:
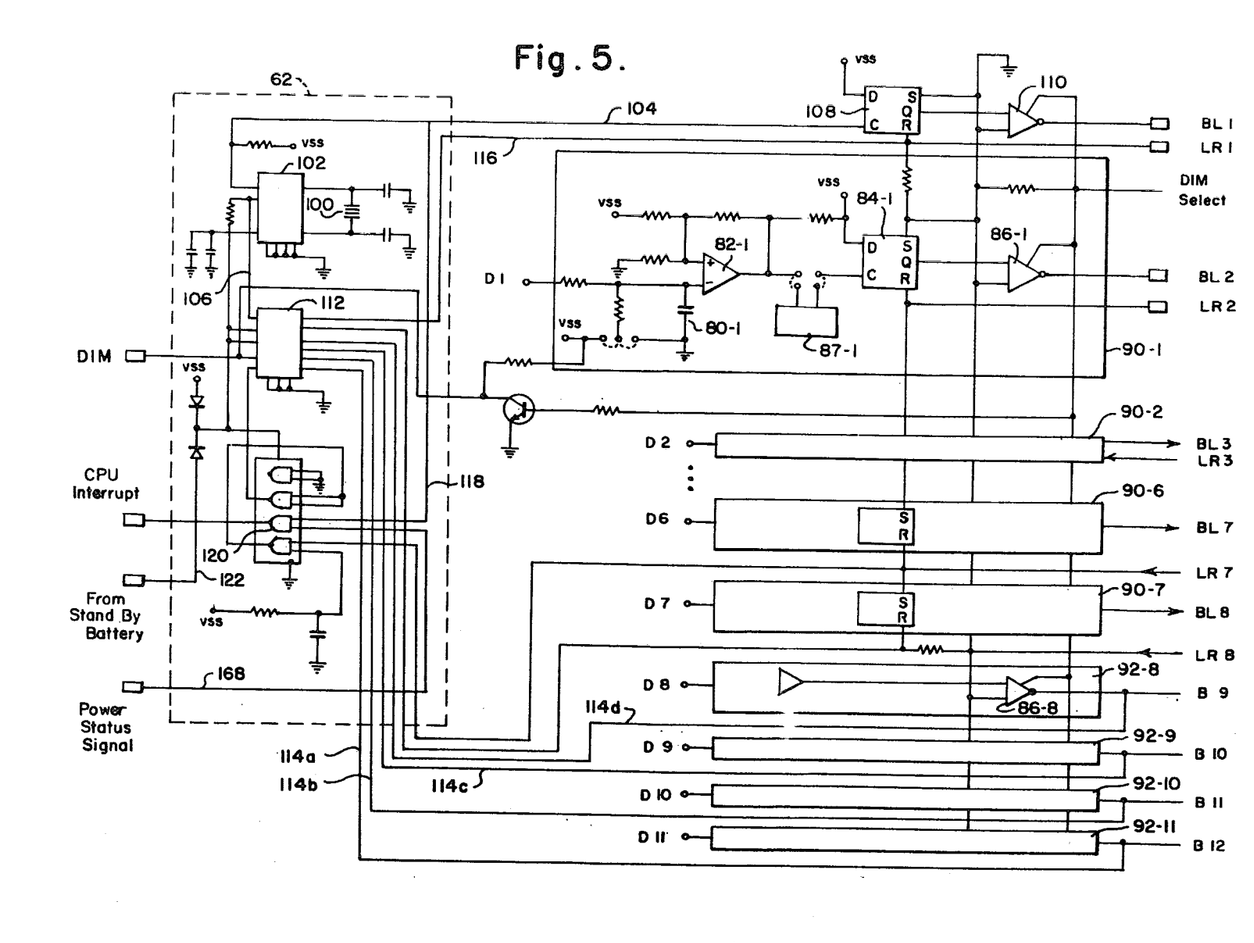
FIG. 5 shows a detailed schematic diagram of the digital interface and the real time clock circuit.

A more detailed circuit diagram for the digital interface 58 is shown in FIG. 5. Also illustrated in FIG. 5 is a schematic diagram for the real time clock circuit 62. Each channel of the digital interface circuit 58 is seen to comprise a filter 80, comparator 82, flip-flop 84, tri-state buffer 86 and a programmable divide by N counter 87. The programmable divide by N counter is utilized for relatively high frequency input signals as, for example, engine RPM and provides a single output pulse for a programmable number of input pulses. Effectively then, counter 87 slows down the pulse rate for high frequency input signals. These devices, namely devices 80, 82, 84, 86 and 87, interconnected as a unit shown in the Figure form a digital channel interface circuit generally designated 90. Identical circuits are provided for each of the signal channels D2–D7 with small changes as shown associated with the latch reset lines LR7 and LR8 associated with channels 6 and 7 respectively. A similar but not quite identical digital interface circuit is shown at 92 associated with input signals D8–D11. The difference between the digital channel interface circuits 90 and 92 is simply the removal of the flip-flop and the former circuit (see also FIG. 4).

The DIM select signal is an address decode off of the address lines of the computing module 50 and is normally low (logical zero or zero volts) to pass therethrough the signals from the data input lines D1–D11. When the DIM select signal goes high, the tri-state buffers are placed in a high impedance state with the buffer outputs left floating. As such, additional signals interconnected to the output terminals of the buffers 86 may be utilized to feed the input data lines to the central processing unit (CPU) of the computer module 50. Thus, signals tied to the outputs of buffers 86-8, 86-9, 86-10 and 86-11 may be passed to the data input lines of the CPU whenever the $\overline{\text{DIM}}$ select signal is not low, e.g. whenever the DIM signal is present. In this fashion, the tri-state buffers 86 may be utilized to multiplex various signals into the data lines of the CPU. The data input terminals in FIG. 5 are identified as BL1–BL8 and as B9–B12. Reset signals to the flip-flops 84 are fed by the CPU after reading data along terminals BL1–BL8 to reset the corresponding flip-flops 84.

The real time clock circuit 62 is utilized to provide clock signals which are received either by the computer module 50 or by a separate counter in the event that the computer power is turned off, e.g. the vehicle ignition is off. Thus, the real time clock circuit is seen to comprise a crystal oscillator 100 which provides clock signals of 4.194 MHz to a frequency division and conditioning network 102 as, for example, Intersel Model No. 1MC7213. The frequency division and conditioning network 102 divides the crystal clock signals to provide a 16 Hz clock signal along line 104 and a 1 ppm signal along line 106. The 16 Hz clock signals along line 104 are fed to flip-flop 108 and through tri-state buffer 110 to the data terminal BL1 for input to the computer module 50. Normally, the DIM select signal is low thus enabling a continual source of 16 HZ clock signals utilized by the computer module 50 for real time clock tracking purposes.

The one pulse per minute (ppm) clock signal is fed from the frequency division and conditioning network 102 to a five state decade counter 112 which may be, for example, Motorola Model No. 4534. The five stage decade counter counts the 1 ppm pulse and sequentially reads each digit out as a binary conded decminal (BCD) along lines 114a–114d. The BCD digits from decade counter 112 are thus provided at terminals B9–B12 and are multiplexed into the data bus of the computer module 50 upon the occurrence of the $\overline{\text{DIM}}$ signal. It is noted, however, that decade counter 112 is continually reset by the reset line from the computer module 50 at terminal LR1 whenever the CPU of the computer module 50 is operative. Thus, whenever the ignition is on and the vehicle is operating it is a function of the computer module 50 to keep accurate real time and the decade counter 112 is continually reset along terminal LR1 and line 116.

The 16 Hz is also fed along line 118 to one input of NAND gate 120. A second input of the NAND gate 120 is provided by a power status signal supplied from the power supply 60. The power status signal is normally high (logical 1 or 5 volts) when the power supply is operating at acceptable voltage levels. Consequently, the output of the NAND gate 120 provides an interrupt signal to the CPU in time synchronism with the 16 Hz clock signals. Upon receipt of the interrupt signal the CPU of the computer module 50 examines the signal from input terminal BL1 and, if a clock signal exists the interrupt is interpreted as a clock signal interrupt. As such, the computer software updates the real time clock and resets the clock flip-flop 108. The polling time for the CPU to cycle through all of the digital as well as analog input signals is typically on the order of 4 ms. An interrupt signal is, of course, serviced at the highest priority. If a clock pulse does not exist along the data line associated with the input terminal BL1 then the software program governing the computer module 50 interprets the interrupt as a power failure condition and a data protect or shut-down sequence is instituted.

When the vehicle ignition is turned off all power to the system is terminated with the exception of power provided by the standby battery 64 to the real time clock circuit 62 and data memory 54 (see FIG. 2). It is important to note, however, that it is the CPU which is responsible for the power shut down to the on-board subsystem 2. Thus, as seen in FIG. 5, the standby battery power is fed along line 122 to the decade counter 112 as well as the frequency division and conditioning network 102. As such, the 1 ppm pulses are continually stored in the five stage decade counter 112 and thus maintain accurate time even though the engine is inoperative. It is further pointed out that this time keeping function is maintained even if the vehicle battery is completely removed as may be entirely appropriate during a maintenance procedure. The standby battery 64 may typically be housed on the RAM memory board of the data memory 58 and is not effected by removal of the vehicle battery.

After the vehicle is started and power is again supplied to the computer module 50 as well as the other units of the on-board subsystem 2, it is necessary to update the real time counter residing in the data memory 54. Typically, when the computer is operative one or more memory locations within the data memory 54 will be utilized to provide the real time keeping function. When the computer is turned off these data memory locations are no longer operated but the information is nevertheless preserved by means of the standby battery 64, e.g. the memory is non-volatile. It is consequently only necessary to add to the contents of the real time clock counters within data memory 54 the time increment during which the CPU was inoperative i.e. the time increment during which the vehicle engine was turned off. Inasmuch as a five stage decade counter only counts in increments of minutes it is necessary to update the real time clock registers in data memory 54 at the exact time at which the one minute pulse increments the register. Thus, the updating of the real time counters is done when the five stage decade counter increments to the next succeeding minute. At most, it can take only one minute in order to bring the real time clock residing in the data memory up to date. The computer program memory residing in program memory 52 directs the computer module 50 to continually examine the least significant bit of the decade counter 112. The BCD digits are fed to the data bus of the CPU along lines 114a–114d when the engine is first started up and the CPU continually issues a $\overline{\text{DIM}}$ signal to provide a continual sequential readout of the data from decade counter 112. All of the digits which sequentially appear on lines 114a–114d are stored in a temporary time register within the data memory 54. The least significant bit of this temporary time register is continually monitored by the CPU and upon a one increment change thereof the time interval in the temporary time register is utilized to update the real time registers of the data memory 54. At this time the $\overline{\text{DIM}}$ signal is removed and the DIM select signal is consequently generated to enable passage of the 16 Hz clock signals to pass to the CPU. In this fashion, the contents of the decade counter 112 are utilized to maintain an accurate real time counter within the CPU even though the counter 112 counts at rather large increments of 1 ppm. Synchronizing the transfer of the counter 112 to the real time registers within the data memory 54 enables accurate real time tracking even after temporary inoperability of the CPU.

Power Supply Circuit

Figure 6:
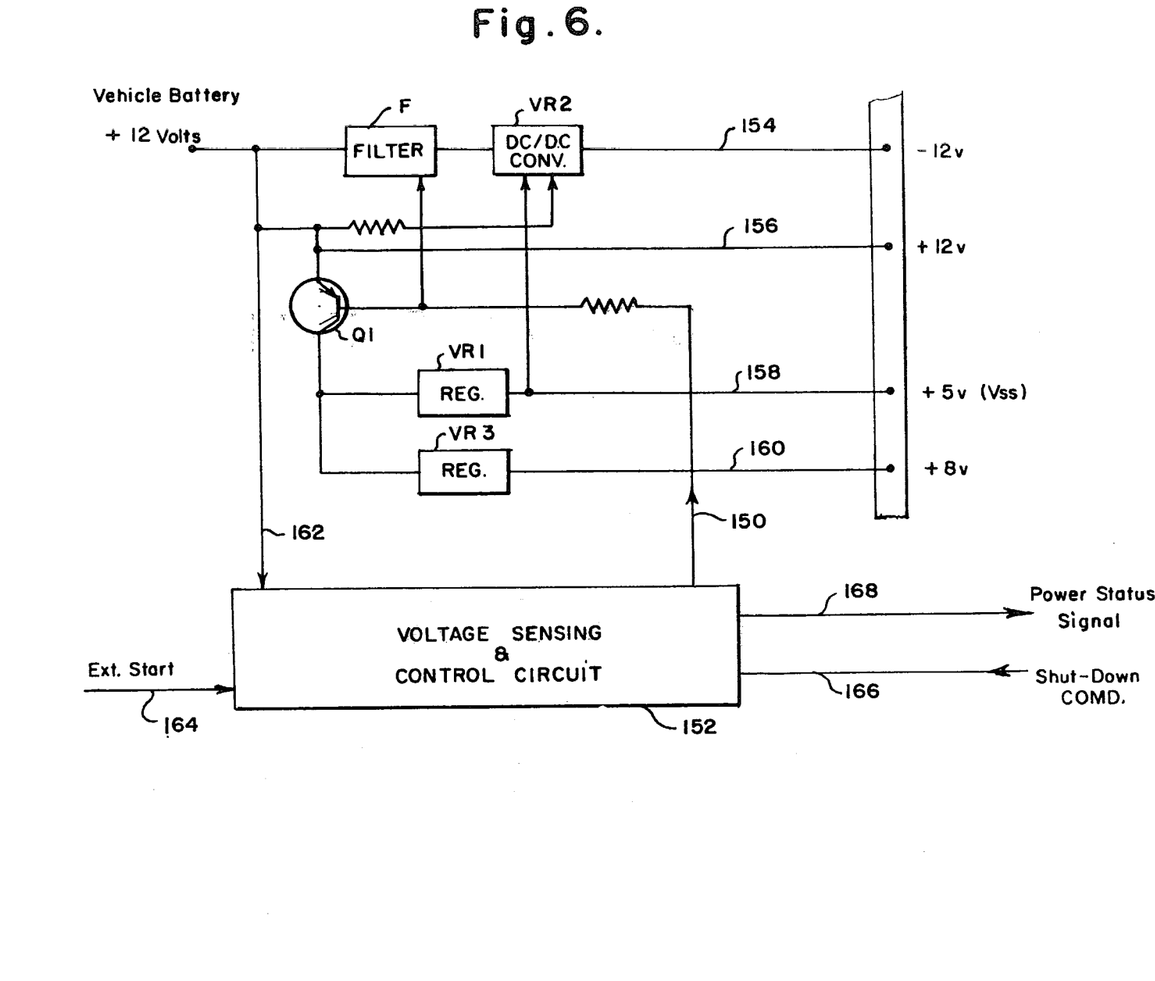
FIG. 6 is a block schematic diagram of the power supply circuit.

FIG. 6 is a block schematic diagram of the power supply 60. The power supply 60 is seen to comprise a filter F, power transistor Q1 and voltage regulators VR1-VR3. Typically, the vehicle battery supplies a 12 volt signal to the emitter junction of power transistor Q1. The base of transistor Q1 is connected by means of a line 150 to a voltage sensing and control circuit 152 which is further described in connection with FIG. 7. Essentially, voltage sensing and control circuit 152 operates to turn on and off the power transistor Q1. In turn, power transistor Q1 is connected for operating voltage regulators VR1-VR3 to provide various output voltage signals along lines 154, 156, 158 and 160. These lines provide respectively voltage levels of −12 v, +12 v, +5 v and +8 v. These voltage levels are utilized to power the various other circuits illustrated in FIG. 2. It is important to realize, however, that all voltage levels are essentially controlled by the power transistor Q1 which in turn is controlled by the voltage sensing and control circuit 152.

A first input to the voltage sensing and control circuit 152 is provided by means of a line 162 which directly supplies the vehicle battery voltage which is subsequently sensed in circuit 152. A further input of the voltage sensing and control circuit 152 is provided by an external start signal along line 164. This signal is provided from the ignition switch and is present whenever the ignition switch is turned on and the engine is in the cranking mode. A further input to the voltage sensing and control circuit 152 is provided from the central processing unit of the control module 50. This signal is the shut-down command provided along a line 166. This command is issued by the CPU of the computer module 50 whenever the detected battery voltage level is below acceptable limits or whenever the CPU detects an engine shut-down condition as for example when the engine is manually turned off. The voltage sensing and control circuit 152 provides a power status signal to the CPU of the control module 50 along line 168. This signal is normally high (nominally 5 volts) but goes low upon detection of an abnormal battery voltage condition. It is this signal, the power status signal, that essentially initiates a data protect or shut-down sequence within the CPU. After the shut-down sequence is completed the CPU then issues the shut-down command to the voltage sensing and control circuit 152 which subsequently turns off the power transistor Q1 thereby shutting down the entire power supply.

Figure 7:
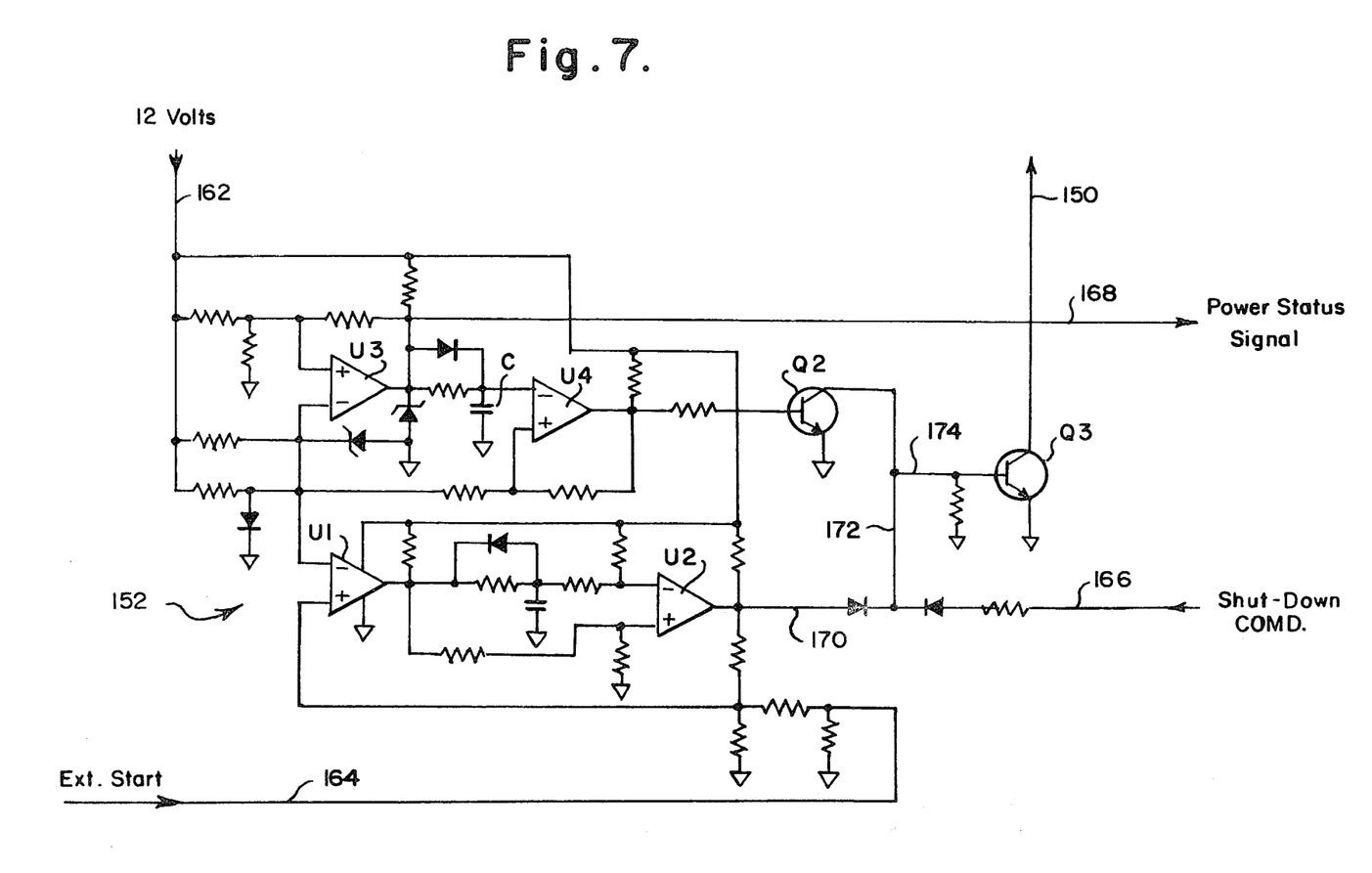
FIG. 7 is a detailed schematic diagram of the voltage sensing and control circuit of FIG. 6.

A schematic diagram of the voltage sensing and control circuit 152 is illustrated in FIG. 7. The voltage sensing and control circuit 152 is seen to comprise a plurality of voltage comparators, U1-U4 and transistors Q2 and Q3. A number of resistors, Zener diodes and diodes are also provided interconnecting the various elements as shown.

The power status signal along line 168 is indicative of the status of the power supply, namely, the vehicle battery power supply which is nominally 12 volts. The 12 volt battery signal is fed into the voltage sensing and control circuit 152 along line 162 and is connected to the positive input of the voltage comparator U3. The output of voltage comparator U3 is normally 5.1 volts maintained by the Zener diodes at the output thereof. Thus, the normal status of the power status signal is a logical 1 corresponding to the 5 volt output of comparator U3. However, the output of comparator U3 will go to zero whenever the voltage magnitude at the minus input is larger than that at the positive input. This condition occurs when the vehicle battery voltage drops below acceptable levels which may, for example, be set at a threshold of approximately 5 volts. The threshold may obviously be selected by means of the resistors dividing the voltage to the inputs of comparator U3. Comparator U3 thus provides a means to sense the vehicle battery source and provide an output signal, the power status signal indicative of the acceptable or unacceptable condition of the vehicle battery. If the power status signal drops to zero volts, the CPU of the computer module 50 will initate a data protect and shut-down sequence and subsequently issue a shut-down command over line 166.

The operation of the voltage sensing and control circuit 152 may be best understood by assuming initially that the vehicle engine is turned off. Under such circumstances, the external start signal along line 164 and representative of an ignition on condition is a logical zero corresponding to 0 volts. This 0 volt signal is fed to the positive input of voltage comparator U1. However, the negative input of voltage comparator U1 is at a higher potential than the positive input inasmuch as this input receives a divided voltage from the vehicle battery source, e.g. non-zero. Under these circumstances the voltage comparator output is low thus forcing the output of voltage comparator U2 to be also low. The zero volt output of voltage comparator U2 is fed via lines 170, 172 and 174 to the base of control transistor Q3. The zero volt on the base of transistor Q3 maintains the transistor in a non-conducting state. The collector of transistor Q3 is connected, however, via a line 150 to the power transistor Q1 (see FIG. 6). Consequently, whenever the control transistor Q3 is off the power transistor Q1 will likewise be off and no power will be delivered to the system.

Let us now assume that the operator of the vehicle turns on the ignition switch and consequently causes the external start signal on line 164 to go high. This high signal is fed to the positive input of voltage comparator U1 forcing its output high and forcing the output of voltage comparator U2 high. In turn, control transistor Q3 turns on giving power to the entire system including the CPU of the computer module 50. After the CPU of the computer module 50 is energized a normal polling sequence examines the power status signal on line 168. Assuming that the vehicle battery source is within acceptable limits, no shut-down signal will be issued. The shut-down command along line 166 is 0 volts to force a shut-down, and nominally 5 volts when no shut-down is desired. Consequently, a 5 volt signal is fed from the CPU of the computer module 50 along lines 166, 172 and 174 to the base of control transistor Q3. Consequently, even after the operator has released the ignition key, the control transistor Q3 will be maintained on since the base voltage is now supplied by the CPU itself which has subsequently been brought up to power.

The CPU may now detect a shut-down condition as, for example, by means of one of the digital or analog sensors. For example, engine rpm may be continually monitored and the absence of an rpm signal triggers the CPU to enter the data protect and shut-down mode. At such time, a 0 volt signal is applied as the shut-down command along lines 166, 172 and 174 to turn off control transistor Q3 and subsequently turn off the power transistor Q1. Nominally a power off condition is detected during a typical polling sequence which may last on the order of 4 ms and the data protect and shut-down routine proceeds immediately in response thereto.

The shut-down command may also be given by the computer module 50 in response to a battery failure condition which would be detected by the CPU by means of the power status signal on line 168. An additional shut-down procedure is also provided in the event of excessive battery drain by means of voltage comparator U4 and transistor Q2. Normally, when the output of voltage comparator U3 is high (corresponding to an acceptable operating condition) the output of comparator U4 is low and thus transistor Q2 is non-conducting. However, when the vehicle battery voltage is inadequate (below 5 volts for example), the output of voltage comparator U3 goes to 0 volts thus forcing the ouput of voltage comparator U4 to a high state. The output of voltage comparator U4 turns on transistor Q2 which in turn turns off the control transistor Q3 thus shutting down power. It is important to note, however, that voltage comparator U4 does not change state instantaneously in response to a low voltage signal at the output of voltage comparator U3. In effect, capacitor C connected at the negative input terminal of voltage comparator U4 maintains a high voltage at the input to the negative terminal thus maintaining the output of U4 in a low state for a time delay roughly on the order of 1-2 seconds. This time delay is effective to permit the CPU of the computer module 50 to detect the power status signal (which immediately goes to 0 volts as per the output of voltage comparator U3) and initiate the data protect and shutdown sequence. If the CPU is operating properly through the entire shut-down routine the CPU itself would issue the shut-down command well in advance of the time delay supplied by capacitor C. However, in the event that no shut-down command ever gets issued, the voltage comparator U4 and transistor Q2 insure that after the time delay the control transistor Q3 will be turned off thus shutting down power to the system.

Further details of the operation of the micro processor are set forth in the computer print-out following page 44 of this specification.

The word vehicle as utilized herein and in the appended claims is not intended to be restricted to truck but generally applies to all forms of vehicles including by way of example, boats, airplanes, trains, tractors, off-highway machines, etc. More generally, a "device" utilizing the principles of the invention is intended to encompass not only vehicle but stationary apparatus such as, for example, generators, engines, plant and process control systems, numerically controlled apparatus and all forms of measuring and testing equipment.

Although the invention has been described in terms of specific preferred embodiments, the invention should not be deemed limited thereto, since other embodiments and modification will readily occur to one skilled in the art. It is therefore to be understood that the appended claims are intended to cover all such modifications as fall within the true spirit and scope of the invention.

What is claimed is:

1. A real time clock circuit for use with an electronic computing apparatus having a central processing unit (CPU) and a memory storage means including a real time clock register comprising:
   (a) means for generating first frequency clock signals;
   (b) means for feeding said first frequency clock signals into said CPU for counting in said real time clock register of said memory storage means;
   (c) first power supply means connected for providing power to said CPU for operating same;
   (d) means for generating second frequency clock signals;
   (e) means for counting said second frequency clock signals;
   (f) second power supply means, independent of said first power supply means, connected to said second frequency counting means for powering same, whereby said second frequency counting means counts said second frequency clock signals independently of said first power supply means;
   (g) means for disconnecting said first power supply means from said CPU;
   (h) means for reconnecting said first power supply means to said CPU after a time interval;
   (i) said second frequency counting means counting said second frequency clock signals during said time interval;
   (j) means for inhibiting counting of said second frequency counting means while said real time clock register is counting said first frequency clock signals;
   (k) means for incrementing said real time clock register in proportion to the counts accumulated in said second frequency counting means during said time interval,
   whereby said real time clock register is updated to account for first frequency clock signals not counted during said time interval.

2. A real time clock circuit as recited in claim 1 wherein said means for incrementing comprises:
   (a) means for sensing the accumulated count in said second frequency counting means substantially immediately after said time interval;
   (b) means for subsequently sensing an incremental count change of said second frequency counting means; and
   (c) said real time clock register incremented in proportion to the number of said accumulated counts and said incremental count change.

3. A real time clock circuit as recited in claim 2 wherein said real time clock circuit is operable in a device monitoring and recording system, said first power supply means comprises a battery used for operating said device, and said means for disconnecting said battery comprises means for disconnecting said battery when said device is not operating.

4. A real time clock circuit as recited in claim 3 wherein the device is a vehicle.

5. A real time clock circuit as recited in claim 4 wherein second power supply means comprises a separate battery.

6. A real time clock circuit as recited in claims 1 or 2, wherein said inhibiting means includes said CPU, said CPU generating an inhibit signal for periodically resetting said second frequency counting means, whereby, upon disconnecting of said first power supply means from said CPU, said CPU terminates generation of said inhibiting signal thereby permitting said second frequency counting means to count.

7. A real time clock circuit as recited in claim 6, wherein the frequency of said first clock signals is on the order to approximately 16 Hz and the frequency of said second clock signals is on the order of approximately 1 ppm.

* * * * *

UNITED STATES PATENT AND TRADEMARK OFFICE
CERTIFICATE OF CORRECTION

PATENT NO. : 4,303,850

DATED : December 1, 1981

INVENTOR(S) : JOHN E. JUHASZ ET AL

It is certified that error appears in the above—identified patent and that said Letters Patent is hereby corrected as shown below:

Column 6, Line 46, delete "A1-A6" and insert --A1-A16--.

Signed and Sealed this

Twenty-fifth Day of January 1983

[SEAL]

Attest:

Attesting Officer

GERALD J. MOSSINGHOFF

Commissioner of Patents and Trademarks